(12) United States Patent
Tanaka et al.

(10) Patent No.: US 7,164,701 B2
(45) Date of Patent: Jan. 16, 2007

(54) SEMICONDUCTOR LASER AND METHOD FOR MANUFACTURING THE SAME

(75) Inventors: Akira Tanaka, Kanagawa (JP); Hirokazu Tanaka, Kanagawa (JP); Yoshiyuki Itoh, Saitama (JP); Koichi Gen-Ei, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 10/388,370

(22) Filed: Mar. 13, 2003

(65) Prior Publication Data

US 2004/0114651 A1  Jun. 17, 2004

(30) Foreign Application Priority Data

Mar. 15, 2002  (JP)  .............................. 2002-072051

(51) Int. Cl.
*H01S 5/00* (2006.01)
(52) U.S. Cl. .................. 372/45.01; 372/46.01
(58) Field of Classification Search ... 372/43.01–46.01
See application file for complete search history.

(56) References Cited

U.S. PATENT DOCUMENTS

| | | | |
|---|---|---|---|
| 5,545,903 A | 8/1996 | Van Der Poel et al. | |
| 5,608,752 A * | 3/1997 | Goto et al. | 372/46 |
| 5,675,601 A * | 10/1997 | Karakida et al. | 372/46 |
| 5,737,351 A | 4/1998 | Ono | |
| 5,818,862 A | 10/1998 | Salet | |
| 5,920,767 A | 7/1999 | Horie et al. | |
| 5,923,691 A * | 7/1999 | Sato | 372/46 |
| 5,949,809 A | 9/1999 | Ashida | |
| 5,960,019 A * | 9/1999 | Hayashi et al. | 372/46 |
| 6,055,255 A | 4/2000 | Suyama et al. | |
| 6,064,079 A * | 5/2000 | Yamamoto et al. | 257/101 |
| 6,160,829 A * | 12/2000 | Sawano | 372/45.01 |
| 6,333,946 B1 * | 12/2001 | Miyashita et al. | 372/46 |
| 6,424,668 B1 * | 7/2002 | Murayama | 372/45 |
| 6,563,850 B1 * | 5/2003 | Matsumoto et al. | 372/45 |
| 6,618,420 B1 * | 9/2003 | Gen-Ei et al. | 372/50.1 |
| 6,664,605 B1 * | 12/2003 | Akulova et al. | 257/432 |

(Continued)

FOREIGN PATENT DOCUMENTS

EP        1 087 480        3/2001

(Continued)

OTHER PUBLICATIONS

U.S. Appl. No. 09/639,018, filed Aug. 15, 2000 Gen-Ei et al.

*Primary Examiner*—Minsun Oh Harvey
*Assistant Examiner*—Phillip Nguyen
(74) *Attorney, Agent, or Firm*—Hogan & Hartson LLP

(57) ABSTRACT

A high-output semiconductor laser of a real index-guided structure comprises: a first conductive type clad layer; active layer for emitting light by current injection; second conductive type first clad layer; second conductive type second clad layer as a ridge waveguide; current-blocking layer formed in both sides of the second conductive type second clad layer and having a larger band gap than those of the second conductive type first and second clad layers; and second conductive type third clad layer having a mobility enough to guide a current to the second conductive type second clad layer and prevent a flow of a leak current into the current-blocking layer.

19 Claims, 5 Drawing Sheets

U.S. PATENT DOCUMENTS 6,768,759 B1 * 7/2004 Honkawa et al. ........ 372/46.01
6,865,202 B1 * 3/2005 Matsumoto .............. 372/45.01

FOREIGN PATENT DOCUMENTS

| | | |
|---|---|---|
| JP | 06-252508 | 9/1994 |
| JP | 06-350188 | 12/1994 |
| JP | 08-032170 | 2/1996 |
| JP | 08-181390 | 7/1996 |
| JP | 10-004238 | 1/1998 |
| JP | 2000-031585 | 1/2000 |
| JP | 2001-210909 | 8/2001 |
| JP | 2001-345518 | 12/2001 |

* cited by examiner

SEMICONDUCTOR LASER AND METHOD FOR MANUFACTURING THE SAME

CROSS-REFERENCE TO RELATED APPLICATIONS

This application is based upon and claims the benefit of priority from the prior Japanese Patent Application No. 2002-072051, filed on Mar. 15, 2002, the entire contents of which are incorporated herein by reference.

BACKGROUND OF THE INVENTION

1. Field of the Invention

The present invention relates generally to a semiconductor laser and a method for manufacturing the same.

2. Related Background Art

Semiconductor lasers for the wavelength of 780 nm using AlGaAs as the material of their active layers (light-emitting layers) have been brought into practical use as writing light sources of optical disks such as CD (compact disk). CDs using this type of semiconductor lasers include CD-R (Recordable) for single time writing and CD-RW (ReWritable) for plural time writing. These writing optical disks have been involved in so-called double-speed races for increasing the disk rotation speed to raise the access speed to several times the standard speed and to increase the magnification. For making one data bit with such a writing optical disk, it is necessary to give certain pulse energy. As the disk rotation speed increases, it is necessary to increase the optical power of the irradiated laser. Therefore, semiconductor lasers for high-speed writing are required to produce high outputs.

In the above-mentioned AlGaAs semiconductor lasers, a ridge-guided structure is often used because high characteristics can be obtained by easy manufacturing methods. Semiconductor lasers having the ridge-guided structure include those of a complex index-guided structure and those of a real index-guided structure. The latter real index-guided structure is less in absorption loss and is remarked as a high throughput semiconductor laser structure.

FIG. 5 is a cross-sectional schematic view showing an existing semiconductor laser with a real index-guided structure. On an n-type GaAs substrate 401, sequentially formed are an n-type clad layer 402 made of $Al_{0.5}Ga_{0.5}As$, guide layer 403 made of $Al_{0.3}Ga_{0.7}As$, AlGaAs/AlGaAs active layer 404, guide layer 405 made of $Al_{0.3}Ga_{0.7}As$ and first p-type clad layer 406 made of $Al_{0.5}Ga_{0.5}As$. Formed on the first p-type clad layer 406 is formed a second p-type clad layer (ridge waveguide) 407 made of $Al_{0.5}Ga_{0.5}As$ in a stripe shape. The ridge waveguide is usually formed by reaction rate controlling wet etching that exposes the (111) A plane. Therefore, as shown in FIG. 5, it becomes trapezoidal with the top width Wu narrower and the bottom width Wd wider. A current-blocking layer 408 made of n-type $Al_{0.55}Ga_{0.45}As$ is formed to lie in opposite sides of the ridge waveguide 407. Then a contact layer 410 made of p-type GaAs overlies the current-blocking layer 408 and the ridge waveguide 407. In the semiconductor laser shown in FIG. 5, a current is injected into the active layer 404 from a p-side electrode 412 and an n-side electrode 411, and laser light L of a wavelength around 780 nm is emitted from the active layer 404. When a current is injected to the active layer 404, the above-mentioned current-blocking layer 408 functions to constrict the current to the area just under the ridge waveguide 407. Additionally, the current-blocking layer 408 produces a difference in refractive index between the portion under the ridge waveguide 407 and the portions at its opposite sides to thereby confine the laser light L in the lower portion of the ridge waveguide 407. In the semiconductor laser of FIG. 5, the refractive index of the current-blocking layer 408 is smaller than those of the p-type clad layers 406, 407. This type of structure relying on refractive indices is called a real index-guided structure. In this structure, the band gap of the current-blocking layer 408 is larger than that of the active layer 404, and the current-blocking layer 408 is translucent for the light L from the active layer 404. Therefore, its absorption loss is small and the throughput is relatively high.

If there were a writing laser device operable at a higher speed than the existing writing laser devices, it could be effectively used for various purposes including CD-R, etc. mentioned above. To realize such a high-speed writing semiconductor laser, a semiconductor laser with a still higher output than conventional writing semiconductor lasers is indispensable. However, the use of a conventional semiconductor laser as shown in FIG. 5 to produce a higher output than now has been considered to be very difficult because it is difficult to accomplish both narrowing the bottom width Wd of the ridge waveguide 407 to raise the kink level and increasing the thickness if the ridge waveguide to reduce the absorption loss by extrusion of light to the GaAs contact later 410.

That is, as shown in FIG. 6, the optical output Po of a semiconductor laser can be certainly enhanced by an increase of the operating current Iop. However, the rate of increase of the optical output relative to the operating current Iop suddenly changes when it reaches a certain value Pk. This is the phenomenon called a kink that derives from primary mode oscillation L1 (FIG. 5) being liable to occur in addition to basic mode oscillation L (FIG. 5) as the normal laser oscillation due to influences of hole burning, etc. That is, the transverse mode of the laser light becomes unstable at the kink level. However, laser light must be stable in semiconductor lasers because the laser light is converged to a minute spot when it is used. Therefore, in order to obtain a semiconductor laser usable for a high output, it is essential to raise the kink level Pk. To raise the kink level Pk in the semiconductor laser of FIG. 5, it is considered desirable to converge the current injected into the active layer 404 by minimizing the bottom width Wd of the ridge waveguide 407. On the other hand, from the viewpoint of reducing the absorption loss by extrusion of light to the contact layer 410 in the semiconductor laser of FIG. 5, it is rather desirable to increase the thickness of the ridge waveguide 407. However, if the bottom width Wd of the ridge waveguide 407 is narrowed while the thickness of the ridge waveguide 407 is maintained thick, the top width Wu excessively narrows and increases the threshold voltage so much to make laser oscillation difficult. As such, the conventional semiconductor laser shown in FIG. 5 is difficult to enhance the confinement of light in the active layer 404 and simultaneously increase the kink level. It is therefore difficult for the semiconductor laser to be raised in kink level than before and used for a higher output.

SUMMARY OF THE INVENTION

The present invention is based on recognition of those problems, and its object is to realize a high-output AlGaAs compound semiconductor laser of a real index-guided type.

According to embodiments of the present invention, there is provided a semiconductor laser comprising:

a first conductive type clad layer;

a light-emitting layer formed on the first conductive type clad layer and having an active layer made of $Al_vGa_{1-v}As$ (where $0 \leq v < x3$) to emit light by current injection);

a second conductive type first clad layer formed on the light-emitting layer;

a second conductive type second clad layer formed in a stripe shape on a part of the second conductive type first clad layer;

a current-blocking layer formed in both sides of the second conductive type second clad layer and having a larger band gap than those of the second conductive type first and second clad layers; and a second conductive type third clad layer made of $Al_{x3}Ga_{1-x3}As$ (where $0.40 \leq x3 \leq 0.46$) on the second conductive type second clad layer and the current-blocking layer.

According to embodiments of the present invention, there is further provided a semiconductor laser comprising:

a substrate made of GaAs of a first conductive type;

a first conductive type clad layer made of $Al_{x0}Ga_{1-x0}As$ (where $0.40 \leq xi \leq 0.46$, i=0, 1, 2, 3);

a light-emitting layer formed on the first conductive type clad layer and having an active layer made of $Al_vGa_{1-v}As$ (where $0 \leq v < xi$) to emit light by current injection);

a second conductive type first clad layer made of $Al_{x1}Ga_{1-x1}As$ on the light-emitting layer;

a second conductive type second clad layer made of $Al_{x2}Ga_{1-x2}As$ in a stripe shape on a part of the second conductive type first clad layer;

a current-blocking layer of the first conductive type made of $Al_yGa_{1-y}As$ (where $0.50 \leq y \leq 0.56$) formed in both sides of second conductive type second clad layer;

a second conductive type third clad layer made of $Al_{x3}Ga_{1-x3}As$ on the second conductive type second clad layer and the current-blocking layer;

a contact layer of the second conductive type formed on the second conductive type third clad layer and having a band gap smaller than that of the second conductive type third clad layer;

a first electrode formed in electrical connection with the substrate; and a second electrode formed on the contact layer in electrical connection therewith.

According to embodiments of the present invention, there is further provided a method for manufacturing a semiconductor laser comprising:

sequentially forming a first conductive type clad layer made of $Al_{x0}Ga_{1-x0}As$ (where $v < xi \leq y$, i=0, 1, 2, 3), an active layer made of $Al_vGa_{1-v}As$ (where $0 \leq v < xi$), a second conductive type first clad layer made of $Al_{x1}Ga_{1-x1}As$ and an $Al_{x2}Ga_{1-x2}As$ layer by MOCVD;

forming a stripe dielectric insulating film on the $Al_{x2}Ga_{1-x2}As$ layer, and partly removing the $Al_{x2}Ga_{1-x2}As$ layer by wet etching using the dielectric insulating film as a mask to form a stripe second conductive type second layer having (111) A planes exposed on side surfaces thereof;

sequentially forming a current-blocking layer made of $Al_yGa_{1-y}As$ of the first conductive type and a cap layer made of InGaP to sandwich the second conductive type second clad layer from opposite sides thereof by MOCVD using the dielectric film as a mask;

removing the dielectric film and the cap layer; and forming a second conductive type third clad layer made of $Al_{x3}Ga_{1-x3}As$ layer on the current-blocking layer and the second conductive type second clad layer by MOCVD.

According to embodiments of the present invention, there is further provided a semiconductor laser comprising:

a first conductive type clad layer;

a light-emitting layer formed on the first conductive type clad layer and having an active layer for emitting light by current injection);

a second conductive type first clad layer formed on the light-emitting layer;

a second conductive type second clad layer formed in a stripe shape on a part of the second conductive type first clad layer;

a current-blocking layer formed in both sides of the second conductive type second clad layer and having a larger band gap than those of the second conductive type first and second clad layers;

a cap layer formed on the current-blocking layer, said cap layer having a band gap larger than that of the active layer and containing a group V element different from that of the current-blocking layer; and a second conductive type third clad layer formed on the cap layer and the second conductive type second clad layer.

DETAILED DESCRIPTION OF THE INVENTION

Semiconductor lasers according to embodiments of the invention will now be explained below with reference to the drawings. These embodiments will be explained as being applications to real index-type AlGaAs compound semiconductor lasers.

Figure 1:
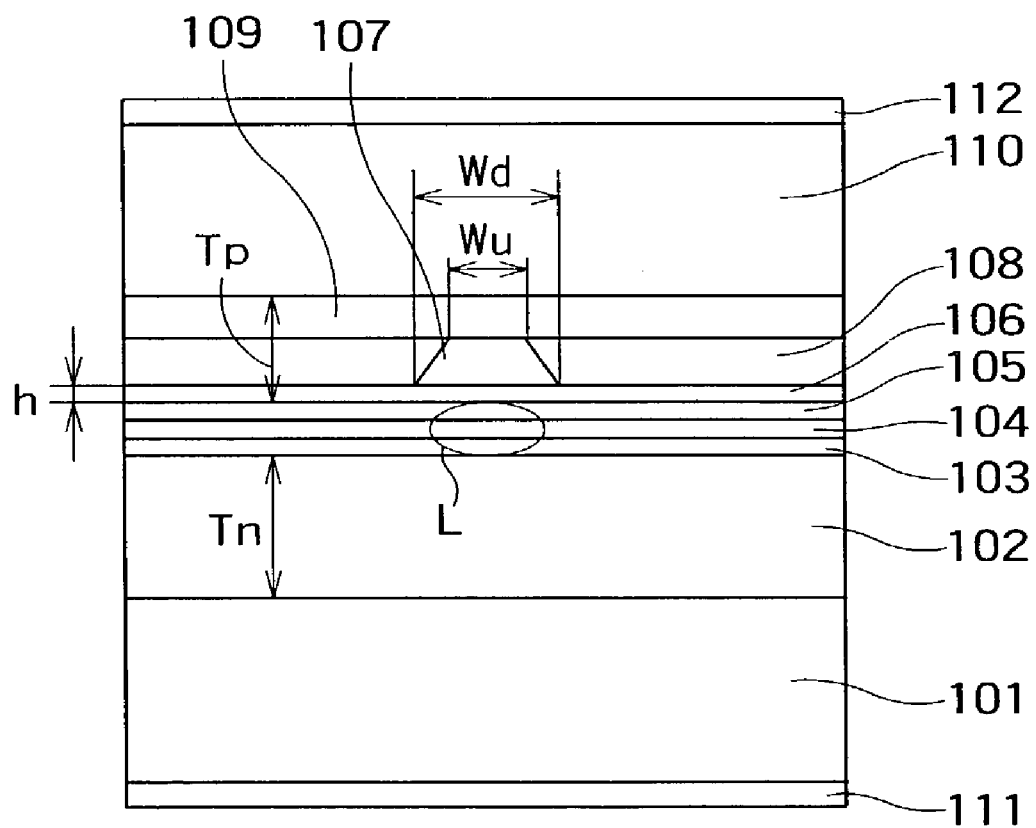
FIG. 1 is a schematic cross-sectional view showing a semiconductor laser according to the first embodiment of the invention.

One of features of the semiconductor lasers according to these embodiments lies in, as apparent from FIG. 1, comprising a third p-type clad layer 109, the third p-type clad layer made of $Al_{x3}Ga_{1-x3}As$ ($0.40 \leq x3 \leq 0.46$). In the laser of FIG. 1, the third p-type clad layer 109 contributes to satisfactory reduction of the absorption loss by extrusion of light to the contact layer 110. Additionally, the third p-type clad layer 109 has a high mobility because of its low Al composition x3. Therefore, the third p-type clad layer 109 guides the current to the ridge waveguide 107 and prevents leakage of a current to the current-blocking layer 108. These features enable reduction of thicknesses of the ridge waveguide 107 and the current-blocking layer 108, and hence enable reduction of the bottom width Wd of the ridge waveguide 107. As such, a semiconductor laser free from kinks to a high output range can be provided.

Another feature of the semiconductor lasers according to the embodiments lies in, as apparent from FIGS. 1, all of four clad layers 102, 106, 107, 109 being made of $Al_{xi}Ga_{1-xi}As$ ($0.40 \leq xi \leq 0.46$, $i=0, 1, 2, 3$). This feature contributes enhancing the mobility of the respective clad layer and realizing a high-output semiconductor laser.

Figure 4:
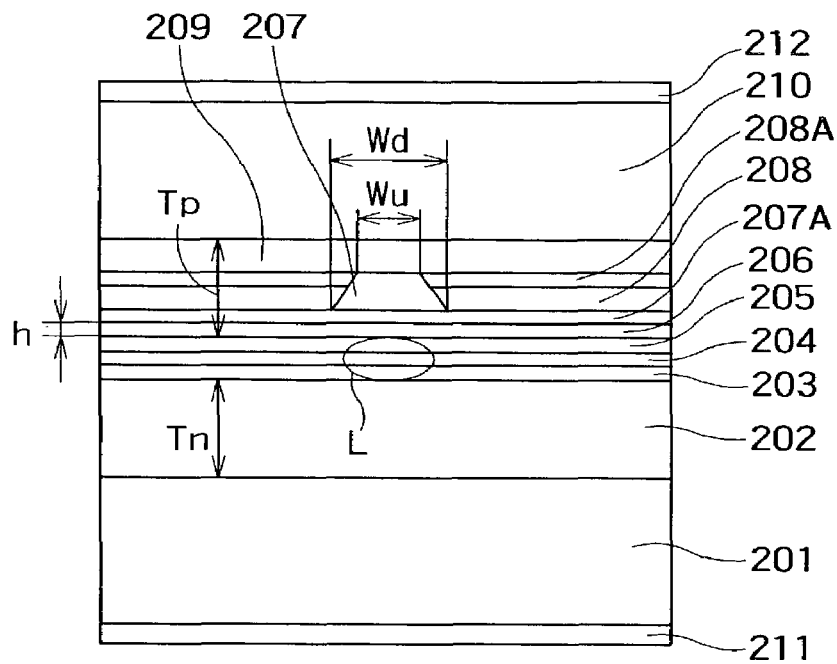
FIG. 4 is a schematic cross-sectional view showing a semiconductor laser according to the second embodiment of the invention.

Another feature of the semiconductor lasers according to the embodiments lies in, as apparent from FIG. 4, comprising a cap layer 208A in form of a thin InGaP film on the current-blocking layer 208 made of AlGaAs. The cap layer 208A makes it possible for the third p-type clad layer 209 to effectively guide the current to the ridge waveguide 207. Thus a high-output semiconductor laser can be obtained.

Explained below are two embodiments with reference to FIGS. 1 through 4.

FIRST EMBODIMENT

FIG. 1 is a schematic cross-sectional view showing a semiconductor laser according to the first embodiment of the invention. The semiconductor laser is composed of an n-type (first conductive type) clad layer 102 made of $Al_{0.45}Ga_{0.55}As$, n-side (first side) guide layer 103 made of $Al_{0.25}Ga_{0.75}As$, AlGaAs/AlGaAs active layer 104, p-side (second-side) guide layer 105 made of $Al_{0.25}Ga_{0.75}As$, and first p-type (second conductive type) clad layer 106 made of $Al_{0.45}Ga_{0.55}As$, which are sequentially deposited on an n-type GaAs substrate 101. More specifically, the active layer 104 has a MQW (Multiple Quantum Well) structure alternately overlapping 5 nm thick well layers of $Al_wGa_{1-w}As$ ($0 \leq w \leq 0.15$) and 5 nm thick barrier layers of $Al_{0.25}Ga_{0.75}As$. On a part of the first p-type clad layer 106, a second p-type clad layer 107, which is a 0.5 μm thick, stripe $Al_{0.45}Ga_{0.55}As$ film, is formed as a ridge waveguide. As explained later, since the ridge waveguide 107 is formed by reaction rate-controlling wet etching that exposes the (111)A plane, it forms a forward mesa ridge as shown in FIG. 1. The ridge bottom width Wd of the ridge waveguide 107 is approximately 2.0 μm, and the ridge top width Wu thereof is approximately 1.3 μm. In both sides of the ridge waveguide 107, a current-blocking layer 108 having a thickness around 0.5 μm, which is made of $Al_{0.55}Ga_{0.45}As$, is formed. The current-blocking layer 108 is an n-type semiconductor layer and blocks the current flowing from a p-side electrode 112 toward the active layer 104. A 2.5 μm thick third p-type clad layer 109 made of $Al_{0.45}Ga_{0.55}As$ overlies the current blocking layer 108 and the ridge waveguide 107. The third p-type clad layer 109 is one of features of the instant embodiment, and contributes to enhancing the output of the semiconductor laser as explained later. The third p-type clad layer 109 cooperates with the second p-type clad layer 107, first p-type clad layer 106 and n-type clad layer 102 to confine carriers in the active layer 104. For the purpose of satisfactory reduction of the absorption loss by extraction of light to the contact layer 110 and the GaAs substrate 101, thickness Tn of the n-type clad layer 102 is adjusted approximately to 3.0 μm, and the total thickness Tp of the p-type cladding layers 106, 107, 109 is adjusted approximately to 3.2 μm. Additionally, for the purpose of preventing convergence of the current injected to the active layer 104, thickness h of the first p-type clad layer 106 is adjusted to 0.2 μm. Formed on the third p-type clad layer 109 is a contact layer 110 made of p-type GaAs and doped with Zn by $1 \times 10^{17}/cm^3$ or more. In the actual size of the semiconductor laser of FIG. 1, the n-type GaAs substrate 101 is approximately 100 μm thick, and the entire thickness of the deposited layers 102 through 110 is approximately 10 μm. However, FIG. 1 shows them in a different proportion of thicknesses for easier illustration and explanation.

In the semiconductor laser of FIG. 1, a current is injected to the active layer 104 from the p-side electrode (second electrode) 112 formed on the p-type contact layer 110 in electrical connection thereto and the n-type electrode (first electrode) 111 formed under the substrate 101, in the illustration, in electrical connection thereto. The current-blocking layer 108 blocks part of the current from the p-side electrode 112 toward the active layer 104 and converges the current to the ridge waveguide 107. By converging the current to a portion of the active layer 104 just under the ridge waveguide 107, the current-blocking layer lowers the threshold voltage and simultaneously minimizes generation of the transverse high-order mode. Additionally, since the current-blocking layer 108 is made of $Al_{0.55}Ga_{0.45}As$, it has a smaller refractive index and a larger band gap than the ridge waveguide 107 made of $Al_{0.45}Ga_{0.55}As$. Therefore, the semiconductor laser of FIG. 1 is of a real index-guided type in which the current-blocking layer 108 does not absorb light from the active layer 104. As such, when the current is injected to just under the ridge waveguide 107, laser light L of a wavelength around 780 nm is emitted from near the portion of the active layer 104 just under the ridge waveguide 107. The active layer 104 and the guide layers 103, 105 at opposite sides of the active layer 104, altogether, can be regarded as a light-emitting layer 103~105.

In the semiconductor laser of FIG. 1 explained above, since the total thickness Tp of the p-type clad layers 106, 107, 109 is adjusted to 3.2 μm, the absorption loss by extraction of light to the contact layer 110 can be reduced.

Moreover, in the semiconductor laser of FIG. 1, since the first p-type clad layer 106 is as thick as 0.2 μm, the current injected from the ridge waveguide 107 to the active layer 104 via the first p-type clad layer 106 can be converged without diverging elsewhere. As a result, emission of laser light L can be stabilized.

Furthermore, in the semiconductor laser of FIG. 1, the top width Wu of the ridge waveguide 107 is as wide as 1.3 μm, the threshold voltage does not rise.

Figure 6:
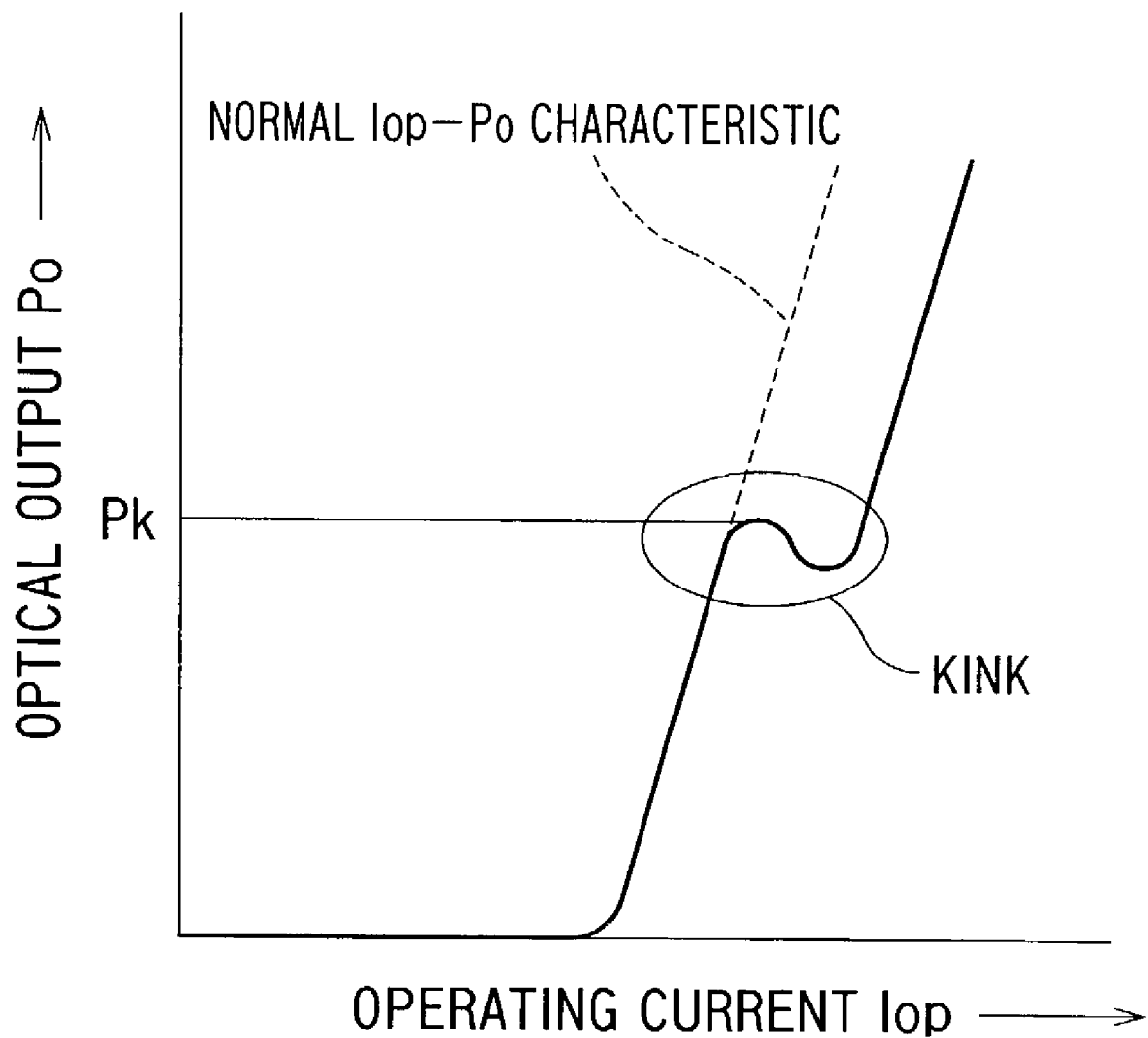
FIG. 6 is a diagram for explaining a kink of a semiconductor laser.

In the semiconductor laser of FIG. 1, the third p-type cladding layer 109 makes it possible to increase the total thickness Tp of the p-type clad layers as thick as 3.2 μm while reducing the thickness of the ridge waveguide 107 as thin as 0.5 μm approximately. Therefore, the bottom width Wd of the ridge waveguide 107 can be reduced as narrow as 2.0 μm while ensuring the top width Wu as wide as 1.3 μm. As a result, the current injected to the active layer 104 can be converged, thereby to raise the kink level Pk (FIG. 6) and realize a high-output semiconductor laser. Concrete values of the maximum output will be explained later.

In contrast, in the conventional semiconductor laser (FIG. 5) having the thick ridge waveguide 407, it was inevitable that the top width Wu of the ridge waveguide 407 became unacceptably narrow when the bottom width wd was narrowed to 2.0 μm. Then, when the top width Wu was narrowed too much, the laser could not accomplish laser oscillation due to a difficulty of the current flow in the active layer 104 and a resultant increase of the threshold voltage. Additionally, in the conventional semiconductor laser (FIG. 5), when the ridge waveguide 407 was thinned while keeping a certain value of the top width Wu, the bottom width Wd was certainly narrowed but it became difficult to confine the current (carriers) in the active layer 404, and the laser oscillation was again difficult to occur.

Figure 5:
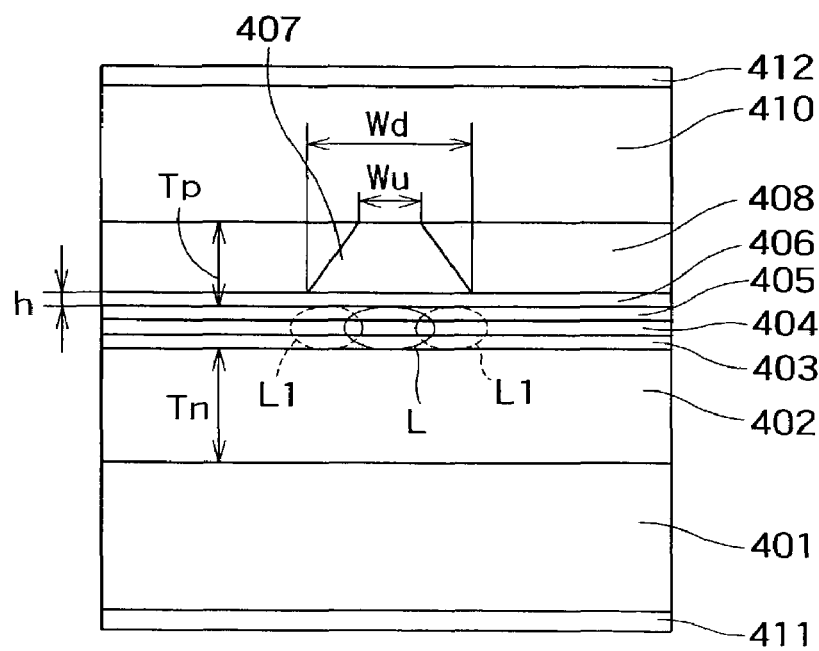
FIG. 5 is a schematic cross-sectional view of a conventional semiconductor laser of a real index-guided type.

Furthermore, in the semiconductor laser of FIG. 1, since the p-type clad layers 106, 107, 109 are made of $Al_{0.45}Ga_{0.55}As$ in which the Al composition is lower than that of the p-type $Al_{0.5}Ga_{0.5}As$ clad layers 406, 407 (FIG. 5)

of the conventional GaAlAs compound semiconductor laser, the leak current to the current-blocking layer 108 does not increase regardless of the current-blocking layer 108 being as thin as 0.5 μm. That is, $Al_{0.45}Ga_{0.55}As$ is intermediate between direct transition and indirect transition, and its mobility is higher than that of $Al_{0.5}Ga_{0.5}As$ that is the complete indirect transition type. Therefore, the third p-type clad layer 109 of the semiconductor laser shown in FIG. 1 has a mobility high enough to guide the current to the ridge waveguide 107 and prevent inflow of the leak current to the current-blocking layer 108. As a result, the third p-type clad layer 109 reliably guides the current to the active layer 104 from the ridge waveguide 107 without increasing the leak current to the current-blocking layer 108. By preventing a leak current to the current-blocking layer 108 in this manner, a high-output semiconductor laser can be realized.

In contrast, if the Al composition of the p-type clad layers 106, 107, 109 is 0.5 or more, a leak current undesirably generates in the current-blocking layer 108. That is, in the laser device of the real index-guided type, since the n-type $Al_{0.55}Ga_{0.45}As$ current blocking layer 108 has the high Al composition, its crystalline property is not high. If the Al composition of the p-type clad layers 106, 107, 109 is raised to 0.5 or more, then the mobility of these p-type clad layers decreases, and the transverse extension resistance of the third p-type clad layer 106 increases, and a large potential difference is produced in the deposition direction of the current-blocking layer 108. Therefore, if the current blocking layer 108 is thinned to approximately 0.5 μm, then a leak current undesirably generates in the current-blocking layer 108. The increase of the leak current invites an increase of the useless current not contributing to emission of the active layer 104, and a high-output semiconductor laser is difficult to obtain.

Figure 2:
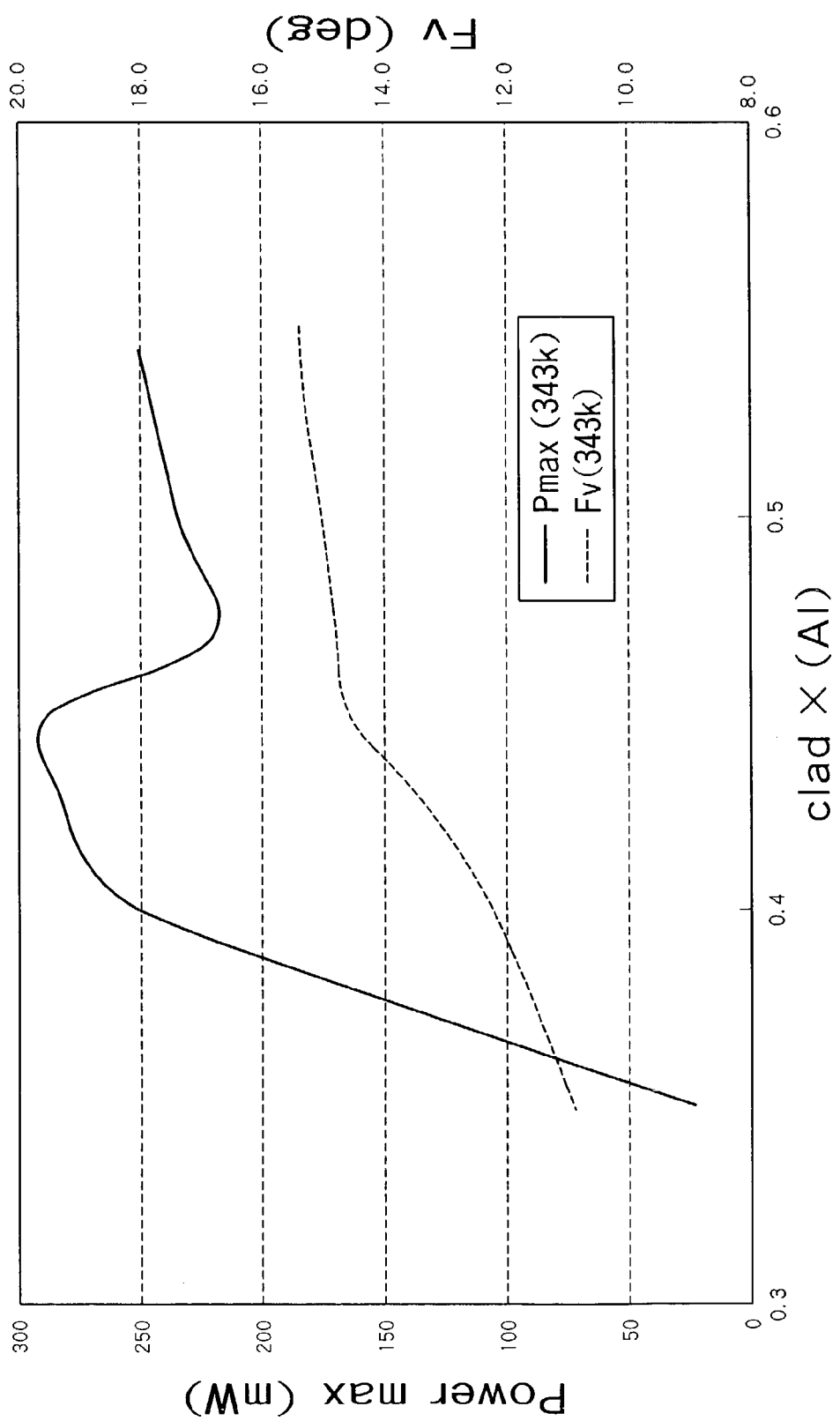
FIG. 2 is a diagram showing relations among Al composition x of cladding layers 102, 106, 107, 109 made of $Al_xGa_{1-x}As$, maximum output Pmax and vertical divergence angle Fv in the semiconductor laser according to the first embodiment of the invention.

Further, since the clad layers 102, 106, 107, 109 of the semiconductor laser shown in FIG. 1 are made of $Al_{0.45}Ga_{0.55}As$ lower in Al composition, the difference of their refractive index from that of the active layer 104 can be reduced to narrow the vertical divergence angle Fv of the laser light L (see FIG. 2). Such a narrow divergence angle Fv makes it convenient to use the semiconductor laser because the laser light L for use is converged to a minute spot in the semiconductor laser.

As explained above, since the semiconductor laser of FIG. 1 includes the third p-type clad layer 109 and uses $Al_{0.45}Ga_{0.55}As$ having the lower Al composition as the clad layers 102, 106, 107, 109, it is possible to reduce the bottom width Wd of the ridge waveguide 107 while confining a satisfactory quantity of carriers in the active layer 104 without increasing the leak current to the current-blocking layer 108 raising the threshold voltage. Thereby, a semiconductor laser capable of preventing a kink up to a high output range and supplying a high maximum output can be realized. Additionally, the divergence angle Fv of the laser light L can be narrowed.

It is surprising for ordinary engineers to reduce the Al composition of $Al_xGa_{1-x}As$ clad layers 102, 106, 107, 109 as low as 0.45 in a real index-guided AlGaAs semiconductor laser because it has been believed with the conventional AlGaAs compound semiconductor laser (FIG. 5) that a decrease of the Al composition x of the clad layers 402, 406, 407 would invite insufficient confinement of carriers in the active layer 404 and would cause a decrease of the maximum output Pmax. However, the Inventor of the present invention conducted in-depth study on relationship between the Al composition of the $Al_xGa_{1-x}As$ clad layers 102, 106, 107, 109 and the maximum output Pmax, and got aware of the fact that a high-output laser could be obtained by adjusting the Al composition of the $Al_xGa_{1-x}As$ clad layers 102, 106, 107, 109. This is explained below with reference to FIG. 2.

FIG. 2 is a diagram showing relations among Al composition x of cladding layers 102, 106, 107, 109 made of $Al_xGa_{1-x}As$, maximum output Pmax and vertical divergence angle Fv. The solid line represents the maximum output Pmax. The broken line represents the vertical divergence angle Fv of the laser light L. As already explained, the divergence angle Fv had better be narrow. It is known that the divergence angle Fv becomes wider as the Al composition of the clad layers 102, 106, 107, 109 is increased as shown in FIG. 2. Therefore, from the viewpoint of narrowing the divergence angle Fv, it is desirable to limit the Al composition x of the clad layers 102, 106, 107, 109 within a low level. It is believed, however, that a decrease of the Al composition of clad layers 102, 106, 107, 109 in AlGaAs compound semiconductor lasers, in general, causes a decrease of the difference in band gap between these clad layers and the active layer 104, hence invites insufficient confinement of carriers in the active layer 104, and results in a decrease of the maximum output Pmax. Therefore, in ordinary semiconductor lasers (FIG. 5), the Al composition x of the clad layers 402, 406, 408 is adjusted approximately to 0.5, and the divergence angle Fv is adjusted approximately to 15°, as a compromise between narrowing the divergence angle Fv and raising the maximum output Pmax. Also in the Inventor's experiment, as it have been believed before, the maximum output Pmax go down as the Al composition decreases in the range of the Al composition larger than 0.46 as shown in FIG. 2. However, it is confirmed from the Inventor's experiment that, contrary to the conventional common knowledge, the maximum output Pmax rise when the Al composition Pmax is controlled in the range from 0.40 to 0.46. The Inventor assumes that its reason lies in that the control of the Al composition of the clad layers 102, 106, 107, 109 in the range from 0.40 to 0.46 brings the advantage of enhancing the mobility surpassing the disadvantage of worsening the confinement of carriers in the active layer 104.

Next explained is a manufacturing method of the semiconductor laser of FIG. 1. One of features of manufacturing method of the semiconductor laser of FIG. 1 lies in once forming an InGaP cap layer on the current-blocking layer 108 to prevent oxidation of the surface of the current-blocking layer and thereafter removing this InGaP cap layer. This contributes to improving the crystalline property of the second conductive type third clad layer 109 and enhancing its mobility.

(1) First of all, the method prepares an n-type GaAs substrate 101 having a (100)-oriented major surface and sized 2 inches in diameter, and sequentially deposits thereon, by MOCVD, an n-type clad layer 102 made of $Al_{0.45}Ga_{0.55}As$, n-side guide layer 103 made of $Al_{0.25}Ga_{0.75}As$, AlGaAs/AlGaAs active layer alternately stacking some cycles of $Al_wGa_{1-w}As$ ($0 \leq w \leq 0.15$) well layer and $Al_{0.25}Ga_{0.75}As$ barrier layers, p-side guide layer 105 made of $Al_{0.25}Ga_{0.75}As$, first p-type clad layer 106 made of $Al_{0.45}Ga_{0.55}As$, and $Al_{0.45}Ga_{0.55}As$ layer 107'. The $Al_{0.45}Ga_{0.55}As$ layer 107' is processed by etching to the second p-type clad layer (ridge waveguide) 107 as explained later. A thin-film InGaP layer may be additionally formed on the $Al_{0.45}Ga_{0.55}As$ layer 107' to prevent oxidation of its surface.

(2) In the next step, a stripe $SiO_2$ film is formed on the $Al_{0.45}Ga_{0.55}As$ layer 107' by photolithography, and using this SiO$_2$ film as a mask, the Al$_{0.45}$Ga$_{0.55}$As layer 107' is partly removed by reaction rate-controlling wet etching to obtain the stripe second p-type clad layer (ridge waveguide) 107 having exposed (111) A planes on the side surfaces. This contributes to improving crystalline properties of the side surfaces of opposite sides of the stripe ridge waveguide 107 as well as the current-blocking layer 108 explained subsequently. The SiO$_2$ film may be replaced by another dielectric insulating film.

(3) In the next step, by MOCVD using the SiO$_2$ film as a mask, the current-blocking layer 108 made of Al$_{0.55}$Ga$_{0.45}$As and the cap layer made of InGaP are sequentially formed to sandwich the second p-type clad layer 107 from opposite sides thereof.

(4) In the next step, the crystal substrate is removed from the MOCVD apparatus into the atmospheric air. In this process, the InGaP cap layer abates the surface oxidation of the current-blocking layer 108. After that, the SiO$_2$ mask on the ridge waveguide 107 and the InGaP cap layer on the current-blocking layer 108 are moved. After removal of them, the crystal substrate is immediately set in a MOCVD apparatus to prevent surface oxidation of the current-blocking layer 108.

(5) In the next step, the third p-type clad layer 109 of p-type Al$_{0.45}$Ga$_{0.55}$As is formed to overlie the current-blocking layer 108 and the second p-type clad layer 107 by MOCVD. Thereafter, the p-type GaAs contact layer 110, as well as the p-side electrode 112 and the n-side electrode 111, are formed to complete the semiconductor laser of FIG. 1.

In the above-explained manufacturing method of the semiconductor laser of FIG. 1, since the InGaP cap layer is once formed on the current-blocking layer and thereafter removed, it minimizes the time for which the surface of the current-blocking layer 108 is exposed to the atmospheric air, and thereby minimizes surface oxidation of the current blocking layer 108. The current-blocking layer 108 minimized in surface oxidation has a good crystalline property and can reduce the leak current therein. Moreover, this current-blocking layer 108 improves the crystalline property of the third p-type clad layer 109 thereon to enhance the mobility thereof. Thus, the third p-type clad layer 109 has the mobility high enough to reliably guide the current to the ridge waveguide 107 and to prevent its flow into the current-blocking layer 108, and thereby still more reduces the leak current in the current-blocking layer 108. As such, the addition of the step of once forming the InGaP cap layer and thereafter removing it contributes to preventing the leak current in the current-blocking layer 108 and facilitates employment of the structure having the third p-type clad layer 109.

In contrast, without the InGaP cap layer, the Al$_{0.55}$Ga$_{0.45}$As current-blocking layer 108 higher in Al composition is more likely to suffer surface oxidation. This results in deteriorating the crystalline property of the current-blocking layer 108, degrading the mobility of the third p-type clad layer 109 and inviting a leak current in the current-blocking layer 108. Therefore, it was difficult for the conventional manufacturing method not using the InGaP cap layer to use the third p-type clad layer 109.

In the semiconductor laser of FIG. 1 explained above, all of the first conductive type clad layer 102, second conductive type first clad layer 106, second conductive type second clad layer 107, and second conductive type third clad layer 109 are made of Al$_{0.45}$Ga$_{0.55}$As. However, even when the second conductive type third clad layer 109 is made of Al$_{0.45}$Ga$_{0.55}$As whereas the other clad layers are made of, for example, Al$_{0.5}$Ga$_{0.5}$As, the effect of enhancing the maximum output Pmax (FIG. 2) was obtained.

In the semiconductor laser of FIG. 1, although the ridge waveguide 107 is 0.5 μm thick, the thickness may be changed. However, if it is thicker than 1.0 μm, it may invite a rise of the threshold voltage and a kink. On the other hand, if it is thinner than 0.2 μm, it may more easily invite a leak current in the current-blocking layer 108. Therefore, thickness of the ridge waveguide 107 is preferably controlled in the range from 0.2 μm to 1.0 μm (equal to or more than 0.2 μm and equal to or less than 1.0 μm).

Furthermore, in the semiconductor laser shown in FIG. 1, the bottom width Wd of the ridge waveguide 107 is 2.0 μm wide. However, this width may be changed. However, if it is narrower than 1.5 μm, then the top width Wu becomes so narrow as to invite a rise of the threshold voltage. If it is wider than 3.0 μm, then the ridge waveguide 107 cannot converge the current injected to the active layer, and invites unstable emission of laser light L and generation of a kink. Therefore, the bottom width Wd of the ridge waveguide 107 is preferably controlled in the range from 1.5 μm to 3.0 μm (equal to or more than 1.5 μm and equal to or less than 3.0 μm ).

In the semiconductor laser of FIG. 1, the first p-type clad layer 106 is 0.2 μm thick, but the thickness maybe changed. However, if it is thinner than 0.1 μm, then the difference in refractive index between the portion under the ridge waveguide 107 and the portions at its opposite sides becomes so large as to invite a kink. In contrast, if it is thicker than 0.3 μm, then the current to be injected to the active layer 104 undesirably diverges. Therefore, thickness of the first p-type clad layer 106 is preferably controlled in the range from 0.1 μm to 0.3 μm (equal to or more than 0.1 μm and equal to or less than 0.3 μm).

In the semiconductor laser of FIG. 1, total thickness Tp of the p-type clad layers 106, 107, 109 is 3.2 μm, and thickness Tn of the n-type clad layer 102 is 3.0 μm. These thicknesses, however, may be changed, but both Tp and Tn are preferably controlled not to be below 2.5 μm in order to ensure reduction of the absorption loss by extraction of light to the contact layer 110 and the GaAs substrate 101.

In the semiconductor laser of FIG. 1, Al composition y of the Al$_y$Ga$_{1-y}$As current-blocking layer 108 is 0.55, but it may be changed otherwise. However, if it is smaller than 0.50, it is difficult to obtain sufficient properties required for the real index-guided structure. If it is larger than 0.56, the crystalline property will deteriorate. Therefore, Al composition y of the Al$_y$Ga$_{1-y}$As current-blocking layer 108 is preferably adjusted in the range from 0.50 to 0.56.

Still in the semiconductor laser of FIG. 1, Al composition z of the Al$_z$Ga$_{1-z}$As guide layers 103, 105 is 0.25, but may be changed otherwise. However, if it is lower than 0.20, difference in refractive index from that of the well layers of the active layer 104 will be too small to reliably confine light in the well layers, and it will be difficult for them to perform the role as guide layers. If the Al composition z is higher than 0.28, difference in diffractive index from that of the clad layers 102, 106, 107, 109 will be too small for them to perform the role as guide layers. Therefore, Al composition z of the guide layers 103, 105 is preferably controlled in the range from 0.20 to 0.28.

SECOND EMBODIMENT

Figure 3:
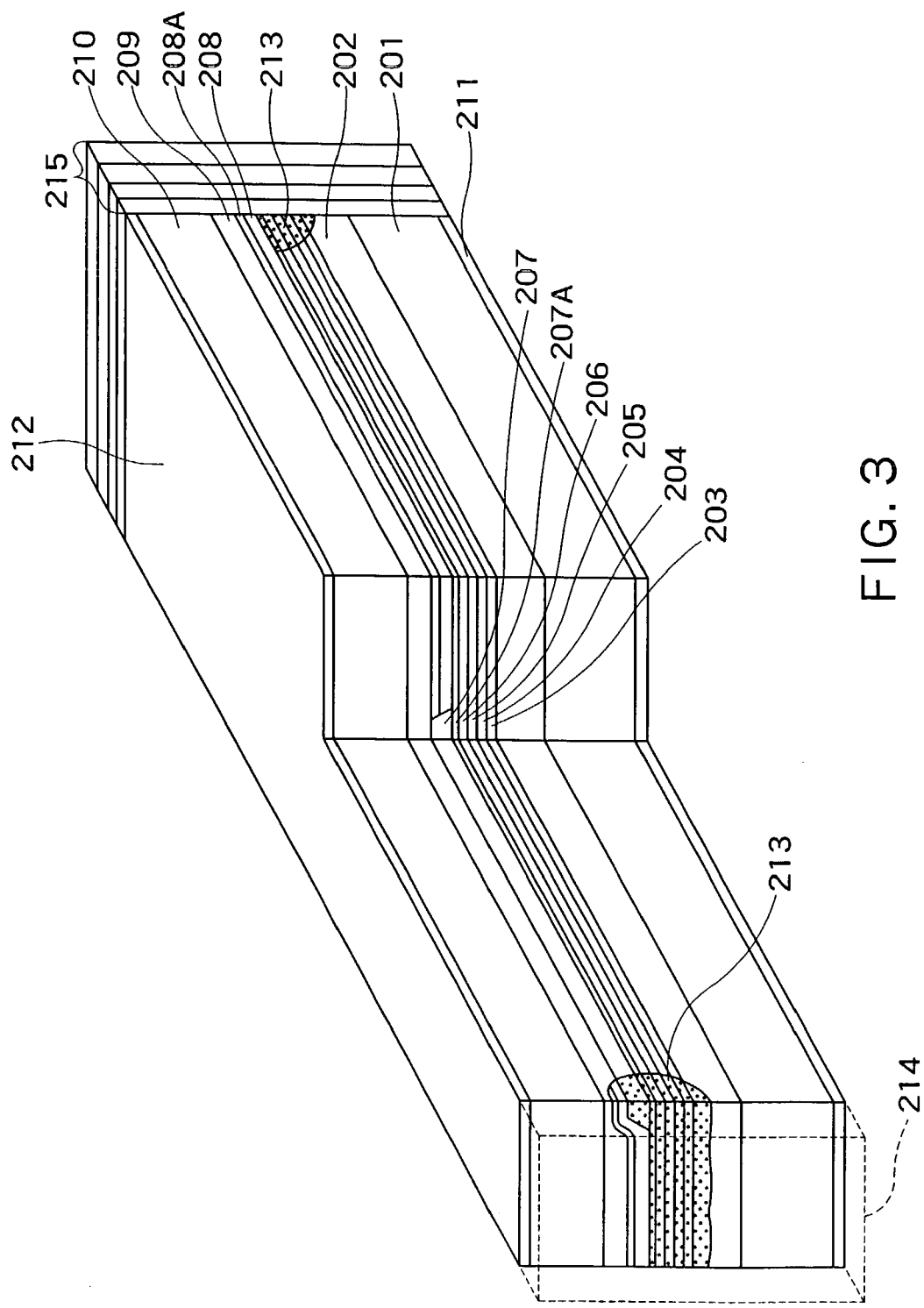
FIG. 3 is a schematic perspective view showing a semiconductor laser according to the second embodiment of the invention.

One of features of a semiconductor laser according to the second embodiment lies in including a cap layer 208A made of p-type InGaP on the current-blocking layer 208 as shown in FIGS. 3 and 4 for the purpose of enhancing the mobility of the third p-type clad layer 209. Explanation will be made below focusing to features different from the first embodiment.

FIG. 3 is a schematic perspective view showing the semiconductor laser according to the second embodiment of the invention, and FIG. 4 is a schematic cross-sectional view of a central part of the semiconductor laser. Similarly to the first embodiment, the AlGaAs/AlGaAs active layer 204 has a MQW structure alternately overlapping 5 nm thick well layers of $Al_wGa_{1-w}As$ ($0 \leq w \leq 0.15$) and 5 nm thick barrier layers of $Al_{0.25}Ga_{0.75}As$. The clad layers 202, 206, 207, 209 sandwiching the active layer 204 from vertically opposite sides in the illustration are made of $Al_{0.5}Ga_{0.5}As$ higher in Al composition than the first embodiment (FIG. 2). This is the same as the Al composition of the conventional semiconductor laser (FIG. 5). In response to the Al composition of the clad layers 202, 206, 207, 209 being 0.5, Al composition of the guide layers 203, 205 is 0.3. The guide layers 203, 205 and the active layer 204, altogether, can be regarded as a light-emitting layer 203~205. The semiconductor laser shown in FIG. 4 includes an etching stop layer 207A of p-type InGaP. In the process of forming the ridge waveguide 207 by wet etching, the etching stop layer 207A determines the terminal point of the etching to enable the ridge waveguide 207 to be formed with a good reproducibility. Additionally, the semiconductor laser shown in FIG. 4 includes the third p-type clad layer 209 similarly to the first embodiment. One of features of the semiconductor laser shown in FIG. 4 lies in including a cap layer 208A in addition to the third p-type clad layer 209. The cap layer 208A is made of InGaP having a larger band gap than the active layer 204, and does not absorb light from the active layer 204. The use of the compound semiconductor material having a larger band gap than the active layer to form the cap layer 208A contributes to preventing a rise of the threshold current and a decrease of the emission efficiency caused by absorption of laser light traveling through the active layer and a loss of the light therein. The use of the cap layer 208 enables realization of the high-output semiconductor laser having a low threshold value as explained later.

As shown in FIG. 3, each semiconductor laser chip composed of the above-explained multi-layered structure 202~209 includes Zn-diffused regions 213 near opposite edge regions of the active layer 204 and its neighbors for the purpose of preventing irreversible damage (COD: catastrophic optical damage) of the active layer 204 along the edges. Additionally, a low reflectance film 214 having a reflectance not higher than 20% is formed on the front edge of the chip, and a high reflectance film 215 having a reflectance not lower than 90% is formed on the rear edge, for the purpose of protecting the edges and obtaining a high optical output. These Zn-diffused regions, 213, low reflectance film 214 and high reflectance film 215 may be provided even in the first embodiment (FIG. 1).

In the semiconductor laser of FIGS. 3 and 4 explained above, the cap layer 208A prevents surface oxidation of the current blocking layer 208 and thereby improves the crystalline property of the current-blocking layer 208. It additionally improves the crystalline property of the third p-type clad layer 209 formed on the current-blocking layer 208, and thereby enhances its mobility. Therefore, regardless of its high Al composition, the third p-type clad layer 209 made of $Al_{0.5}Ga_{0.5}As$ has mobility high enough to reliably guide the current to the ridge waveguide 207 and prevent a flow of leak current into the current-blocking layer 208. As a result, it is possible to obtain a high-output semiconductor laser in which the third p-type clad layer efficiently guides the current from the ridge waveguide 207 to the active layer 204.

If the InGaP cap layer 208A is not provided, the third p-type clad layer 209 made of $Al_{0.5}Ga_{0.5}As$ degrades in crystalline property, and its mobility lowers. Thus the transverse divergence resistance of the third p-type increases, and a large potential difference is produced in the deposition direction of the current-blocking layer 208. As a result, a leak current occurs in the current-blocking layer 208, and the increase of the useless current not contributing to emission of the active layer 204 makes it difficult to obtain a high-output laser.

Furthermore, in the semiconductor laser shown in FIG. 3 having the Zn-diffused regions 213, irreversible damage of edges can be prevented regardless of a high output. More specifically, once a semiconductor laser is improved in kink level and enhanced in output like the semiconductor laser according to the instant embodiment, edge destruction by laser light gradually controls the maximum output. This is because, under the condition where the semiconductor laser emits laser light of a high optical output, a decrease of the bang gap of the active layer 204, called band gap constriction, occurs near the chip edges, and absorption of light occurs in the active layer 204 near the edges. Once the absorption of light occurs, the heat generated thereby and the heat generated by non-radiative recombination of electron-hole pairs accelerate the band gap constriction, and increase the absorption of light. This is a phenomenon called positive feedback, and finally brings about COD, i.e. meltdown of the edges by light and heat. COD is believed to occur around 4 $MW/cm^2$ in case of AlGaAs compound lasers, and it will adversely affect the reliability of the semiconductor laser according to the instant embodiment having a very high output. Taking it into consideration, the instant embodiment uses the Zn-diffused regions 213 made by diffusing zn near chip edges. The diffusion of Zn disorders selective regions of the active layer 204 near the edges by a certain constant ratio, and the band gap of the active layer 204 in these regions becomes larger than that of the inner region thereof. Therefore, a high-output laser free from COD by the aforementioned mechanism and having a high reliability can be realized. Desirable width (window length) of the Zn-diffused regions 213 is 5 μm to 40 μm from the edges according to an experiment by the Inventor. If the window length is shorter than 5 μm, positional accuracy is not ensured when the chip edges are made by cleavage, and the expected effect of the windows is difficult to obtain. If the window length exceeds 40 μm, since the absorption of light of the window regions is about 60/cm, absorption loss becomes unacceptably large, and the semiconductor laser will result in having properties unsuitable for use in optical disks, such as deterioration of the emission efficiency and an increase of the oscillation threshold value.

Next made is a review on thickness and material of the cap layer 208A. Although the cap layer 208A in the semiconductor layer of FIG. 4 is 0.005 μm, and it is made of InGaP, the thickness and the material may be changed otherwise. Therefore, acceptable range of the thickness and usable materials will be discussed below.

First regarding the thickness, according to an Inventor's experiment, when an InGaP cap layer 208A is thinner than 0.001 μm, a high-output laser is difficult to obtain. The Inventor presumes that its reason lies in that the excessively thin cap layer 208A could not serve to improve the crystalline property of the third p-type clad layer 209 and its mobility. Also when the InGaP cap layer 208A is thicker than 0.010 µm, it is again difficult to obtain a high-output laser. The Inventor presumes that its reason lies in that the excessively thick InGaP cap layer 208A deteriorated the crystalline property of the third p-type clad layer 109 made of $Al_{0.5}Ga_{0.5}As$ due to the difference of the cap layer 208A from the third p-type clad layer 109 in lattice constant and thermal expansion coefficient. Thus the Inventor confirmed through the experiment that a high-output semiconductor laser could be obtained by controlling the thickness of the InGaP cap layer 208A in the range from 0.001 µm to 0.010 µm (equal to or more than 0.001 µm and equal to or less than 0.010 µm).

Turning to the material of the cap layer 208A, according to an Inventor's experiment, even when the cap layer 208A is made of GaP or InGaAlP in lieu of InGaP, the Inventor can confirm the effect of improving the crystalline property and mobility of the third p-type clad layer 209. Even when InN, InGaN, GaN, or the like, is used, the same or equivalent effect is obtained. Based upon this result, the Inventor conducted another experiment, and as a result, the Inventor could confirm that, when the cap layer 208A is made of a material having a band gap larger than that of the active layer 204 and containing a group V element different from that of the current-blocking layer 209, the effect of improving the crystalline property and mobility of the third p-type clad layer 209 is certainly obtained. The Inventor assumes that its reason lies in the cap layer 208A made of a material containing a group V element different from that of the current-blocking layer 208 produces a large difference in effective mass between the current-blocking layer 208 and the cap layer 208A, and it is effective for improving the crystalline property. It is also assumed that another reason of that effect lies in that the cap layer 208A made of a material having a band gap larger than that of the active layer 204 does not absorb the light L from the active layer 204. From the viewpoint of the emission efficiency of the active layer 204, the following explanation will be also persuasive. That is, when the cap layer 208A is made by using a semiconductor material larger in bad gap than the active layer 204 and containing a group V element different from that of the current-blocking layer 208, any semiconductor material in which a hole has a small effective mass can be selected. For example, if $Al_{0.5}Ga_{0.5}As$ is selected as the material of the third p-type clad layer 209, p-type InGaP may be selected as the material of the cap layer 208A so that the cap layer 208A contains P having a smaller effective mass than As as the group V element, and can hence injects holes of a higher energy level to the p-type clad layer 207 to bring about more effective recombination in the active layer 204. Even when the cap layer 208A is fully removed by etching to bring the third p-type clad layer 209 into direct contact with the current-blocking layer 208, the use of the InGaP cap layer 208A makes it easier to select an etchant exhibiting a larger etching selectivity with respect to the AlGaAs current-blocking layer 208. This is a great advantage for the manufacturing. With any of those materials, the Inventor's experiment demonstrates that it is preferable to limit the thickness in the range from 0.001 µm to 0.010 µm.

As such, it has been confirmed to be preferable that the cap layer 208A is controlled in thickness in the range from 0.001 µm to 0.010 µm and made of a material having a larger band gap than that of the active layer 204 and containing a group V element different from that of the current-blocking layer 208.

The semiconductor laser shown in FIG. 4 explained above can be manufactured by the same method as the manufacturing method of the semiconductor laser according to the first embodiment (FIG. 1) except that the cap layer 208A is not removed and rather maintained as shown in FIGS. 3 and 4 while the manufacturing method of the semiconductor laser according to the first embodiment removes the cap layer.

In the semiconductor laser of FIG. 4 heretofore explained, the clad layers 202, 206, 207, 209 are made of $Al_{0.5}Ga_{0.5}As$. Instead, however, they may be made of $Al_{0.45}Ga_{0.55}As$ similarly to the first embodiment (FIG. 1). It is also acceptable to change a different Al composition value of the material. However, according to the Inventor's experiment, the Al composition bi of the clad layers 202, 206, 207, 209 made of $Al_{bi}Ga_{1-bi}As$ (i=0, 1, 2, 3) is preferably controlled in the range from 0.40 to 0.50 (see FIG. 2).

Still in the semiconductor laser of FIG. 4, the active layer 204 has a MQW structure alternately stacking 5 nm thick well layers and 5 nm thick barrier layers. However, in order for the Zn-diffused regions 213 to effectively prevent COD, both the well layers and the barrier layers are preferably controlled in thickness not to exceed 7 nm each. This is because the well layers and the barrier layers had better be thin to bring about the above-explained disordering more easily.

Although the second embodiment has been explained by way of the AlGaAs compound semiconductor laser in which the active layer 204 is made of AlGaAs, the invention is applicable to semiconductors, in general, which include a cap layer 208A having a larger band gap than that of the active layer 204 and containing a group V element different from that of the current-blocking layer 208, as well as a third p-type clad layer 209 overlying the cap layer 208A and the ridge waveguide 207. For example, the invention is applicable to quaternary compound semiconductor lasers using InGaAlP as the active layer 204 and GaN compound semiconductor lasers using InGaN as the active layer 204.

What is claimed is:

1. A semiconductor laser comprising:
   a first conductive type clad layer;
   a light-emitting layer formed on the first conductive type clad layer and having an active layer made of $Al_vGa_{1-v}As$ (where $0 \leq v < x3$) to emit light by current injection;
   a second conductive type first clad layer formed on the light-emitting layer;
   a second conductive type second clad layer formed in a stripe shape on a part of the second conductive type first clad layer;
   a current-blocking layer formed in both sides of the second conductive type second clad layer and having a larger band gap than those of the second conductive type first and second clad layers; and
   a second conductive type third clad layer made of $Al_{x3}Ga_{1-x3}As$ (where $0.40 \leq x3 \leq 0.46$) formed on the second conductive type second clad layer and the current-blocking layer.

2. A semiconductor laser according to claim 1 wherein the first conductive type clad layer is made of $Al_{x0}Ga_{1-x0}As$ (where $0.40 \leq x0 \leq 0.46$);
   wherein the second conductive type first clad layer is made of $Al_{x1}Ga_{1-x1}As$ (where $0.40 \leq x1 \leq 0.46$); and
   wherein the second conductive type second clad layer is made of $Al_{x2}Ga_{1-x2}As$ (where $0.40 \leq x2 \leq 0.46$).

3. A semiconductor laser according to claim 1 wherein the current-blocking layer is a first conductive type layer and is made of $Al_yGa_{1-y}As$ (where $0.50 \leq y \leq 0.56$).

4. A semiconductor laser according to claim 1 wherein the second conductive type first clad layer has a thickness in the range from 0.1 µm to 0.3 µm.

5. A semiconductor laser according to claim 1 wherein the active layer has a single or multiple quantum well structure including one or more well layers made of $Al_w Ga_{1-w} As$ (where $0 \leq w \leq 0.15$).

6. A semiconductor laser according to claim 5 wherein the light-emitting layer comprises;
a first side optical guide layer made of $Al_z Ga_{1-z} As$ (where $0.20 \leq z \leq 0.28$);
the active layer formed on said first side optical guide layer; and
a second the optical guide layer made of $Al_z Ga_{1-z} As$ formed on said active layer.

7. A semiconductor laser according to claim 1 wherein Zn-diffused regions are provided in selective regions of the active layer near the edges.

8. A semiconductor laser comprising:
a substrate made of GaAs of a first conductive type;
a first conductive type clad layer made of $Al_{xo} Ga_{1-xo} As$ (where $0.40 \leq xi \leq 0.46$, i=0, 1, 2, 3) formed on the substrate;
a light-emitting layer formed on the first conductive type clad layer and having an active layer made of $Al_v Ga_{1-v} As$ (where $0 \leq v < xi$) to emit light by current injection;
a second conductive type first clad layer made of $Al_{x1} Ga_{1-x1} As$ formed on the light-emitting layer;
a second conductive type second clad layer made of $Al_{x2} Ga_{1-x2} As$ in a stripe shape formed on a part of the second conductive type first clad layer;
a current-blocking layer of the first conductive type made of $Al_y Ga_{1-y} As$ (where $0.50 \leq y \leq 0.56$) formed in both sides of second conductive type second clad layer;
a second conductive type third clad layer made of $Al_{x3} Ga_{1-x3} As$ formed on the second conductive type second clad layer and the current-blocking layer;
a contact layer of the second conductive type formed on the second conductive type third clad layer and having a band gap smaller than that of the second conductive type third clad layer;
a first electrode formed in electrical connection with the substrate; and
a second electrode formed on the contact layer in electrical connection therewith.

9. A semiconductor laser according to claim 8 wherein the contact layer is made of GaAs.

10. A semiconductor laser according to claim 8 wherein the second conductive type first clad layer has a thickness in the range from 0.1 µm to 0.3 µm;
wherein the second conductive type second clad layer has a thickness in the range from 0.2 µm to 1.0 µm and a bottom width in the range from 1.5 µm to 3.0 µm; and
wherein total thickness of the second conductive type first to third clad layers is not less than 2.5 µm.

11. A semiconductor laser according to claim 8 wherein the active layer has a single or multiple quantum well structure including one or more well layers made of $Al_w Ga_{1-w} As$ (where $0 \leq w \leq 0.15$).

12. A semiconductor laser according to claim 11 wherein the light-emitting layer comprises:
a first side optical guide layer made of $Al_z Ga_{1-z} As$ (where $0.20 \leq z \leq 0.28$);
the active layer formed on the first side optical guide layer; and
a second side optical guide layer made of $Al_z Ga_{1-z} As$ formed on said active layer.

13. A semiconductor laser according to claim 8 wherein Zn-diffused regions are provided in selective regions of the active layer near edges.

14. A semiconductor laser comprising:
a first conductive type clad layer;
a light-emitting layer formed on the first conductive type clad layer and having an active layer for emitting light by current injection;
a second conductive type first clad layer formed on the light-emitting layer;
a second conductive type second clad layer formed in a stripe shape on a part of the second conductive type first clad layer;
a current-blocking layer formed in both sides of the second conductive type second clad layer and having a larger band gap than those of the second conductive type first and second clad layers;
a cap layer formed on the current-blocking layer and on both sides of the second conductive type second clad layer, said cap layer having a band gap larger than that of the active layer and containing a group V element different from that of the current-blocking layer; and
a second conductive type third clad layer formed on the cap layer and the second conductive type second clad layer.

15. A semiconductor laser according to claim 14 wherein the active layer is made of $Al_c Ga_{1-c} As$ (where $0 \leq c < 1$) and the cap layer is made of InGaP.

16. A semiconductor laser according to claim 15 wherein thickness of the cap layer is in the range from 0.001 µm to 0.01 µm.

17. A semiconductor laser according to claim 15 wherein the first conductive type clad layer is made of $Al_{b0} Ga_{1-b0} As$ (where $c < bj < e$, j=0, 1, 2, 3);
wherein the second conductive type first clad layer is made of $Al_{b1} Ga_{1-b1} As$;
wherein the second conductive type second layer is made of $Al_{b2} Ga_{1-b2} As$;
wherein the current-blocking layer is made of $Al_e Ga_{1-e} As$; and
wherein the second conductive type third layer is made of $Al_{b3} Ga_{1-b3} As$.

18. A semiconductor laser according to claim 1 wherein the second conductive type second layer has a thickness in the range from 0.2 µm to 1.0 µm and a bottom width in the range from 1.5 µm to 3.0 µm.

19. A semiconductor laser according to claim 1 wherein a total thickness of the second conductive type first to third clad layers is no less than 2.5 µm.

* * * * *